(12) United States Patent
Binder et al.

(10) Patent No.: US 8,263,491 B2
(45) Date of Patent: Sep. 11, 2012

(54) SUBSTRATE WITH FEEDTHROUGH AND METHOD FOR PRODUCING THE SAME

(75) Inventors: Florian Binder, Gauting Buchendorf (DE); Stephan Dertinger, Heidelberg (DE); Barbara Hasler, München (DE); Alfred Martin, München (DE); Grit Sommer, Grafing bei München (DE); Holger Torwesten, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 147 days.

(21) Appl. No.: 11/875,711

(22) Filed: Oct. 19, 2007

(65) Prior Publication Data

US 2008/0217784 A1    Sep. 11, 2008

(30) Foreign Application Priority Data

Oct. 20, 2006   (DE) .......................... 10 2006 049 562

(51) Int. Cl.
*H01L 21/44* (2006.01)
*H01L 23/48* (2006.01)
*H01L 23/52* (2006.01)
*H01L 29/40* (2006.01)

(52) U.S. Cl. ................ 438/667; 257/762; 257/E23.174; 257/E21.597; 257/774; 257/765; 257/E23.011; 257/E23.067

(58) Field of Classification Search .................. 438/667; 257/E23.011, 762
See application file for complete search history.

(56) References Cited

U.S. PATENT DOCUMENTS

| | | | | |
|---|---|---|---|---|
| 4,360,142 A | * | 11/1982 | Carpenter et al. | 228/123.1 |
| 6,221,769 B1 | * | 4/2001 | Dhong et al. | 438/667 |
| 6,448,174 B1 | | 9/2002 | Ramm | |
| 6,743,499 B2 | * | 6/2004 | Suemasu et al. | 428/209 |
| 7,230,318 B2 | * | 6/2007 | Kripesh et al. | 257/621 |
| 7,262,444 B2 | * | 8/2007 | Fillion et al. | 257/177 |
| 2004/0155354 A1 | | 8/2004 | Hanaoka et al. | |
| 2004/0173909 A1 | * | 9/2004 | Sinha et al. | 257/762 |
| 2005/0287783 A1 | * | 12/2005 | Kirby et al. | 438/597 |
| 2006/0038288 A1 | | 2/2006 | Yoshioka et al. | |
| 2006/0043154 A1 | * | 3/2006 | Kirby et al. | 228/37 |
| 2007/0012475 A1 | * | 1/2007 | Kawaguchi et al. | 174/255 |
| 2007/0114204 A1 | * | 5/2007 | Cheng et al. | 216/41 |

FOREIGN PATENT DOCUMENTS

| | | |
|---|---|---|
| DE | 19813239 C1 | 12/1999 |
| EP | 1650797 A2 | 4/2006 |
| JP | 61198657 A | 9/1986 |
| WO | WO-2006099571 A2 | 9/2006 |

OTHER PUBLICATIONS

"German Application Serial No. 2006P52843, Office Action mailed Feb. 26, 2010", 4 pgs.

* cited by examiner

*Primary Examiner* — Ha Tran T Nguyen
*Assistant Examiner* — Aaron Dehne
(74) *Attorney, Agent, or Firm* — Schwegman, Lundberg & Woessner, P.A.

(57) ABSTRACT

A substrate has at least one feedthrough with at least one channel from a first main surface of the substrate to a second main surface of the substrate. The at least one channel is closed off with a first material. The at least one closed-off channel is filled with an electrically conductive second material.

17 Claims, 11 Drawing Sheets

SUBSTRATE WITH FEEDTHROUGH AND METHOD FOR PRODUCING THE SAME

RELATED APPLICATION

This application claims priority to German patent application No. 10 2006 049 562.4 (entitled SUBSTRATE WITH FEEDTHROUGH AND METHOD FOR PRODUCING THE SAME, filed Oct. 20, 2006) which is incorporated herein by reference.

BACKGROUND

Integrated circuits, sensors or micromechanical apparatuses are usually applied on a substrate or integrated into such a substrate. The substrates may be, for example, semiconductor substrates, ceramics, glass substrates or substrates made from other materials. In order to be able to externally connect integrated circuits, it may be useful for the substrates to be provided with electrically conductive feedthroughs from the substrate top side to the substrate underside.

DETAILED DESCRIPTION

Figure 1A:
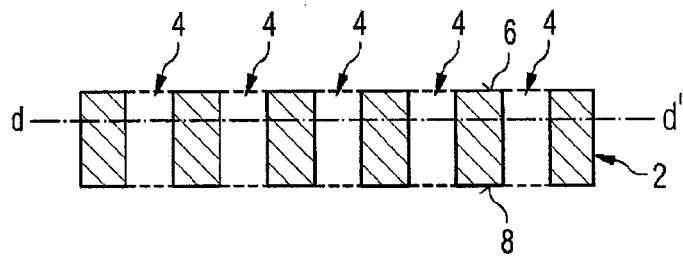
FIGS. 1a, 1b, 1c and 1d show a first method for producing a plurality of feedthroughs through a substrate.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

A substrate and method for producing a feedthrough through a substrate is provided. A substrate has at least one channel from a first main surface of the substrate to a second main surface of the substrate. The at least one channel is closed off with an electrically conductive first material and is filled with an electrically conductive second material.

In one embodiment, a method for producing a feedthrough through a substrate is provided, in which a substrate having at least one channel from a first main surface of the substrate to a second main surface of the substrate is provided, in which the at least one channel is closed off with an electrically conductive first material, and in which the closed-off at least one channel is filled with an electrically conductive second material.

In a further embodiment, a substrate is provided, which has a semiconductor substrate having a first main surface and a second main surface, the semiconductor substrate having at least one channel from the first main surface to the second main surface. Furthermore, the substrate has a first insulation layer, which covers the surface of the substrate in the at least one channel, and an electrically conductive material introduced in the at least one channel and adjoining the first insulation layer.

In still a further embodiment, a semiconductor module comprising a substrate according to the invention and an integrated circuit applied on the substrate is provided.

A number of embodiments are described below, the features of which embodiments merely serve for illustrating the invention and are not intended to limit the latter in any way.

The present invention relates to a method for producing a feedthrough through a substrate. The substrates may serve as carriers in order that devices patterned on the micron scale or nanometer scale, e.g. integrated electrical or electro-optical circuits, sensors or micromechanical apparatuses, are held in position and/or connected to the outside world. In this case, the substrates are often made of insulating materials such as e.g. ceramic, in particular "low temperature cofired ceramic" (LTCC), glass, plastic, glass or carbon fiber-reinforced laminates or similar materials.

The substrates may also be semiconductor substrates, in particular silicon substrates, germanium substrates, GaAs substrates, SiC substrates, etc. In this case, on account of their good patternability and the electronic properties inherent to semiconductors, the substrates may serve both as carriers and as components having integrated active component elements, e.g. transistors, diodes, moveable structure elements, sensor elements, etc. On account of the highly developed semiconductor process technology, the active component elements can be integrated into a semiconductor substrate with a very high density.

If the semiconductor substrates are used as carriers, then they can receive one or a plurality of further semiconductor substrates ("chips") which themselves may serve as carriers and/or are integrated into the active component elements. The chips may be adhesively bonded or soldered onto the carrier substrate, or be fixed in a similar manner. The electrically conductive contacts between the chips or between chip and outside world may be produced, if appropriate, by means of bonding wires, flip-chip bonding or additionally applied interconnects. In this way, a semiconductor substrate can be used as a carrier for producing compact, highly integrated "system in package" (SiP) modules. These modules may be used in the area of communications technology and also automotive, industrial and consumer electronics (e.g. radio-frequency module for mobile telephones, base station or else radar modules for automobiles).

For high system integration it is useful for the substrate to have electrically conductive feedthroughs from one main surface to the other main surface of the substrate. Interconnects on both sides of the substrate can thus be electrically conductively connected to one another. In this way, it is possible to produce short electronic connections between electronic component elements and components which are arranged on opposite main surfaces of the substrate. As a result, a predetermined substrate surface can be utilized economically, package sizes can be minimized and the outlay for additional interconnect layers can be avoided.

By way of example, it is possible to produce direct connections between an integrated component flip-chip-mounted on one main surface of the semiconductor substrate and contact elements arranged on the other main surface of the substrate. If the positions of the electrically conductive feedthroughs are orientated to the positions of the chip contacts, the feedthroughs can provide for short connections to the contact elements in order that e.g. fast signals (e.g. RF signals) are passed outwards as far as possible in a manner free of interference and free of delay.

If a substrate is provided with an integrated circuit on a front side and electrically conductive feedthroughs are furthermore present, the latter can be used to pass signals of the integrated component directly to the rear side of the substrate. In this way, particularly short electrical connections between the integrated circuit and the outside world can be produced with the aid of contact elements soldered onto the electrically conductive feedthroughs. The contact elements on the rear side additionally permit a stack construction in which integrated components can be stacked one above another and be directly contact-connected.

The electrically conductive feedthroughs are produced by providing a substrate having at least one channel from a first main surface of the substrate to a second main surface of the substrate. The first and second main surfaces are usually the two large opposite areas of the substrate. In the case of semiconductor substrates, the main surfaces are usually the two surfaces of a round monocrystalline semiconductor wafer or the sawn parts ("chips") thereof. The areas of a semiconductor wafer are generally standardized according to predetermined wafer diameters, e.g. 4 inches, 8 inches, 10 inches, 12 inches (300 mm). The thicknesses of the wafers may vary within ranges of typically 100-1000 micrometers, where these values may also be smaller or larger in specific applications.

In one embodiment, the at least one channel comprises a first opening on the first main surface and a second opening on the second main surface. If the two openings lie one above another, then the channel can connect the first opening to the second opening in a direction largely perpendicular to the first or second main surface. In this case, the channel length essentially corresponds to the thickness of the substrate.

Depending on the application and substrate material, the cross-sectional area of a channel may assume values of between a few 100 square nanometers and a few square millimeters. Larger or smaller values cannot be ruled out, however. The cross-sectional area may depend on how much current is intended to flow through the electrically conductive feedthrough, whether the electrically conductive feedthrough is also intended to serve for the thermal dissipation of the heat from, by way of example, heat-generating integrated circuits, whether certain induction or capacitance requirements are intended to be met, etc. Finally, the cross-sectional area also depends on how many feedthroughs are intended to be produced and how great the density of the feedthroughs is intended to be.

The production of the at least one or the multiple channels may be effected in many different ways depending on the substrate material. The channels may be, e.g. drilled, etched, stamped, sandblasted, ultrasonically drilled or produced by a laser. On account of the good patternability of semiconductors and the highly developed semiconductor technology, the channels in semiconductor substrates may have particularly small cross-sectional areas. As a result, it is possible to produce a channel density on the substrate surface which corresponds to the feature sizes of an integrated semiconductor component, e.g. a few 100 nanometers.

If the substrate is a semiconductor substrate, then the channels may be produced by a selective etch. By way of example, the channels may be etched selectively with respect to a photoresist or hard mask in a method known to the person skilled in the art, for example by means of an anisotropic etch (dry etch, e.g. reactive ion etching (RIE)). It is thus possible to produce channels having a channel length to channel diameter ratio (aspect ratio) of up to 100 or more. The channels can be produced simultaneously in this way, the cross-sectional areas, cross-sectional form of the channels and also channel density being predetermined by the mask structure.

The method of producing the channels by means of electrochemical etching is likewise known. If the semiconductor substrate is a silicon substrate, then the front side of the semiconductor substrate is incipiently etched selectively with respect to a mask using e.g. 10% strength potassium hydroxide solution for 10 minutes, before the front side of the substrate is covered with an electrolyte, e.g. HF acid having a concentration of 2.5% by weight, and a voltage is applied between the rear side of the substrate and the electrolyte. The voltage is set such that a predetermined current density, e.g. 10 nA per blind hole, flows between substrate and electrolyte. The rear side is simultaneously irradiated by means of a light source, e.g. with a wavelength of 800 nm. As a result of the current between the incipiently etched surface of the substrate and the electrolyte, pores form at the incipiently etched locations and grow into the semiconductor substrate.

The electrochemical etching may be carried out on p-doped or n-doped silicon substrates, the resistivity thereof typically lying within a range of 1-2000 ohm-cm, or 100-1000 ohm-cm. The form, diameter, depth and density of the pores (blind holes) produced depend greatly on the current density, the doping, the acid strengths and the etching time and accordingly have to be determined anew for each new application. Some parameter examples are described in the European Patent Application EP 0 296 348 A1, which is hereby to be regarded as part of the application.

In order to obtain from the blind holes a complete channel from a first main surface to the second main surface, the blind holes may be etched further in a further etching method, e.g. dry- or wet-chemically, until they reach the opposite main surface of the substrate. As an alternative, the blind holes may be opened at the bottom by grinding away the opposite main surface, e.g. planarization by means of chemical mechanical polishing (CMP).

Silicon as a substrate carrier has the further advantage that most of the integrated components are likewise integrated in silicon. In this case, a substrate carrier made of silicon would have the same coefficient of thermal expansion (CTE) as the components mounted onto it. That reduces the destructive mechanical forces which can form between carrier and component on account of thermal cycling during operation.

The method for producing the feedthrough through a substrate further comprises closing off the at least one channel with a first material. The closing-off process may take place at one of the two main surfaces, so that the channels become blind holes closed off on one side again. With the aid of the blind holes, it is possible to fill the channel or channels with a liquid electrically conductive second material at a relative reduced pressure. In this way, the blind hole or blind holes can be largely completely filled even in the case of a large channel length, small channel diameters and even in the case of a channel surface that repels the electrically conductive second material.

The first material, which closes off the at least one channel, may be a different material from that of the substrate. The first material may be chosen e.g. such that it is wetted by the electrically conductive second material during the subsequent process of filling the at least one channel with said electrically conductive second material. As a result of the wetting, the electrically conductive second material can be kept in the at least one channel even if the surface of the substrate is constituted such that it scarcely permits wetting by the second material or does not permit such wetting at all.

In one embodiment, the first material is chosen such that it adheres well to the substrate. It is ensured in this way that said material, as channel closure, keeps the channels tight even when the electrically conductive second material is filled into the channel or channels later. If the substrate is a silicon substrate coated with an oxide layer, by way of example, then good adhesion can be achieved by firstly applying an adhesion layer, e.g. Ti, TiN, Ta, TaN or Cr, to the main surface, to which the first material is then applied.

The first material may be applied by means of a planar process step. It is thereby possible to close off a plurality of channels in a single process step. The closing-off process may be effected for example by means of an electrochemical deposition of metals, e.g. of Cu, Au, Sn, Ag, for the formation of a corresponding metal layer, by means of a sputtering process for the formation of a layer comprising Al, AlSiCu, Ti, TiN, etc., or by means of a pyrolysis step in which a graphite layer is formed by pyrolysis of e.g. methane, ethylene or acetylene in the presence of hydrogen.

As an alternative, the first material may also be the material of a wafer, e.g. a planar semiconductor wafer, or a film, e.g. a plastic film, which are placed onto one of the main surfaces of the substrate and thus close off the channel or channels. In order that the channel or channels can be sealed better, the planar wafer or the plastic film may be provided with a resist, e.g. a photoresist.

Good adhesion of the first material to the substrate surface has the effect that during the deposition, a part of the first material deposits on the surface in the interior of the channels and forms "plugs" in each channel. If the first material is additionally an electrically conductive material, then said "plugs" are also electrically conductive and may become part of the feedthroughs. In this case, a subsequent planarization step, e.g. a CMP step, or dry- or wet-chemical etching may help to isolate and thus electrically insulate the electrically conductive "plugs" from one another.

The filling of the closed-off channel or channels with an electrically conductive second material may serve to provide the material for an electrically conductive feedthrough. The electrically conductive second material may be filled into the channels above its melting point in order to fill the channels as completely as possible and in order to be a solid constituent of the feedthrough after cooling. In this case, the second material may be chosen such that it has a melting point temperature that is lower than that of the first material. This makes it possible to avoid the situation where the channel closure formed by the first material is resolved by excessively great heating during the filling-in process. One advantage of filling the at least one channel may be that this process may have a higher throughput and lower process costs than conventional types of metal filling, particularly in comparison with depositions effected from the vapor phase (CVD) or electrochemical or chemical plating (electroless plating).

The filling with an electrically conductive second material may be effected channel by channel or in parallel. If the channels have been closed off on the first main surface side, then the channels may be filled from the second main surface side, and vice versa. A filling may be effected, e.g. by pouring into the channels. In a further exemplary embodiment, the substrate is dipped into the melt of the electrically conductive second material, so that the melt can penetrate into the channels essentially simultaneously.

In one embodiment, the electrically conductive second material is introduced into the at least one blind hole at a relative reduced pressure. The application of a relative reduced pressure makes it possible for even poorly wetting materials to be introduced into narrow blind holes. It holds true here that the smaller the blind hole cross section, the longer the blind hole and the poorer the wetting, and the greater the relative reduced pressure utilized for filling the blind hole.

By virtue of the relative reduced pressure, the surface in the at least one blind hole need not be provided with an adhesion layer even in the case of a poorly wetting electrically conductive second material. Costly additional processing steps can be obviated by the omission of adhesion layer materials in the blind hole.

Filling the at least one blind hole with poorly wetting electrically conductive second material at relative reduced pressure may have the effect that, on the one hand, the electrically conductive second material penetrates into the blind hole and forms an electrically conductive feedthrough there after solidification and, on the other hand, beads away on the two main surfaces. As a result of the beading away, it is possible to avoid layer formation of the material that solidifies by cooling on the first or second main surfaces. Avoiding such layer formation on the main surfaces can prevent the substrate from being exposed to such high mechanical stresses that it would be damaged in the event of the liquid electrically conductive material cooling and solidifying, on account of different coefficients of thermal expansion.

A relative reduced pressure may be generated by means of an excess pressure that is exerted on the liquid externally in the course of filling the electrically conductive second material. By way of example, an excess pressure of 1 bar to 5 bar, 10 bar or 20 bar may be exerted on the liquid electrically conductive second material. In this way, it is also possible to minimize the volume of the residual gas included in the channels during dipping and to prevent the formation of bubbles.

If the first material is also electrically conductive, then it is advantageous if the electrically conductive first material and the electrically conductive second material come into contact with one another during filling in order to form a common feedthrough. It holds true in this case that the smaller the residual gas volume included in the channel, then the lower the risk that contact between the electrically conductive first material and the electrically conductive second material that is used for a conductive feedthrough will not take place as a result of the formation of bubbles.

The production of a connection in the channel between an electrically conductive first material and a liquid electrically conductive second material may also be improved by dipping the substrate into the liquid electrically conductive second material under a vacuum, that is to say at a pressure of less than e.g. 100 mbar, less than 1 mbar or, if necessary, less than 0.001 mbar. It is thereby possible to reduce the quantity of residual gas in the channels to such an extent that even in very thin and long channels, the liquid electrically conductive second material can advance as far as the solid first material. In this way, the electrically conductive first material and the electrically conductive second material can form a common solid electrically conductive feedthrough body after the cooling of the electrically conductive second material. It should be pointed out that the minimum or maximum pressure values for a complete connection of the conductive materials can be determined depending on the channel cross section, channel length and the surface tension of the electrically conductive second material. The smaller the channel cross section, the larger the blind hole length and the larger the surface tension of the electrically conductive second material, then the larger the relative reduced pressure.

If the first material is not electrically conductive or has only poor electrical conductivity, then it is advantageous for said material to be eliminated again after filling with the electrically conductive second material. This may be done in many different ways depending on the type of the first material. By way of example, it can be etched dry- or wet-chemically or be removed in mechanical or chemical mechanical fashion. If the first material is made of graphite, by way of example, then this can be burnt in the presence of oxygen.

If the substrate is a semiconductor substrate or an electrically conductive substrate, then it is advantageous if the surfaces of the channel inner sides are provided with a first insulation layer. In this way, the feedthroughs of adjacent channels can be electrically insulated from one another. If the substrate is a silicon substrate, then the first insulation layer may be an oxide layer and/or a nitride layer, in particular an $SiO_2$ layer or an $Si_3N_4$ layer. The oxide layer may have been produced e.g. thermally or may have been deposited e.g. in a CVD process (TEOS oxide).

In one embodiment, not only the surface in the channels but the entire surface of the substrate, that is to say that in the channels and that on the two main surfaces of the substrate, is provided with the first insulating layer. In the case of a silicon substrate, this may be effected in a single step, e.g. by thermal oxidation or nitriding of the substrate provided with channels. Moreover, if the material of the first insulating layer is of the type such that it repels the liquid electrically conductive second material, then the channels can be filled with the liquid electrically conductive second material. In this case, it is possible for the liquid electrically conductive second material to wet only the closure or "plug" made of the electrically conductive first material.

If the substrate is a semiconductor substrate, then an integrated component may be applied thereto. In this case, it is possible for process steps by means of which transistors, diodes or other circuit elements, or sensor elements or micromechanical elements are integrated on the semiconductor substrate to be carried out after or before the completion of the feedthroughs.

As an alternative or in addition, further substrates with or without integrated circuits may be applied to the substrate. A high packing density can be obtained in this way. If, by way of example, the further substrate is applied to the substrate in such a way that the integrated component faces the substrate, then the integrated circuits of the first substrate and those of the further substrate can be directly joined together with one another using flip-chip bonding technology, the rear side of the substrate, on account of its feedthroughs, offering a free area for external contact-connection.

The above methods make it possible to produce a substrate having at least one feedthrough from a first main surface to the respective second main surface. Said feedthroughs may be distinguished by the fact that they have the electrically conductive first material in a first sectional plane and the electrically conductive second material in a second sectional plane. Both sectional areas may lie between that of the first main surface and the second main surface. Furthermore, the sectional areas may lie parallel to one another and, if possible, parallel to the two main surfaces. As an alternative, the first sectional plane may also be the first main surface of the semiconductor substrate, and/or the second sectional plane may run in the centre between the first and second main surfaces.

Furthermore, the electrically conductive second material may have a convex curvature on the side remote from the electrically conductive first material. The convex curvature is an expression of the weak wetting of the surface of the substrate by the electrically conductive second material. By virtue of the weak wetting, the channels can be filled with the electrically conductive second material without the material settling on the main surfaces. In this way, no planarization may be used in order to remove the electrically conductive second material from the main surfaces. Moreover, the weak wetting makes it possible to prevent the liquid second material from damaging the substrate when it cools and solidifies on the main surfaces of the substrate and exerts mechanical stress on the substrate in the process due to the change in temperature.

Embodiments which are illustrated schematically and in no way true to scale in the accompanying figures will now be described in detail below.

Figure 1B:
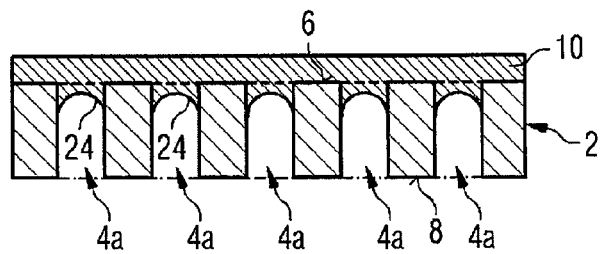
Figure 1C:
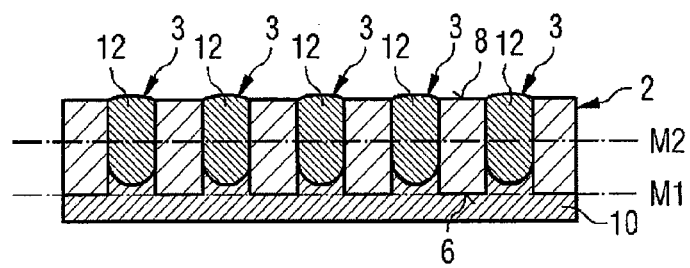
Figure 1D:
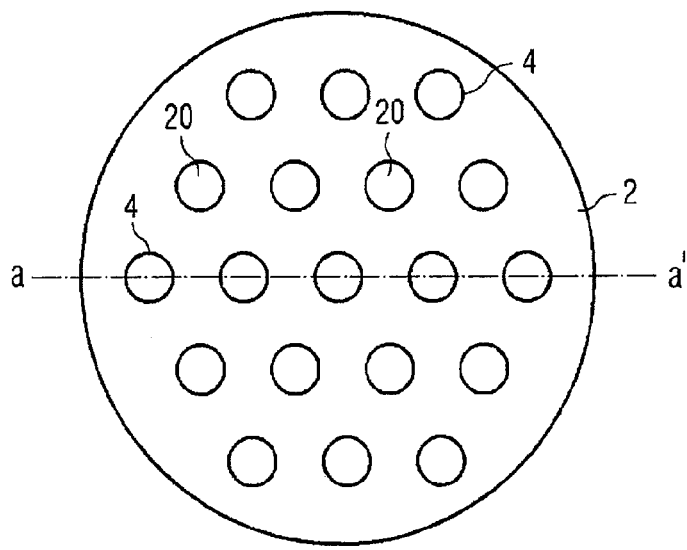

FIGS. 1a-1d show a first embodiment for the production of a substrate 2 with feedthroughs 3. FIG. 1a and FIG. 1d show two mutually perpendicular sections a-a' and d-d', respectively, through the starting material for this method, namely a circular disc 2 made of a ceramic material having nineteen channels 4 which extend from the first main surface 6 to the second main surface 8 and are distributed over the substrate 2. In this example, the ceramic 2 is approximately two millimeters thick and has a disc diameter of e.g. 10 millimeters. The channels each have the same diameter of a few hundred micrometers and are two millimeters long corresponding to the thickness of the ceramic. In this case, therefore, the ratio of channel length to channel diameter ("aspect ratio") is within the range of approximately 3-10. The channels are drilled sequentially in the present case, so that they have round cross-sectional areas 20 and a constant diameter across the channel length.

FIG. 1b shows a first method step, in which the channels 4 are closed off by a layer made of an electrically conductive first material 10. In this case, in a first step, firstly an adhesion material, e.g. Ti, and then copper (neither is shown in FIG. 1b)) are applied to the first main surface 6 of the ceramic 2. This may be effected in a process chamber, e.g. by vapor deposition. The electrically conductive first material 10, in this case made of copper, is subsequently applied galvanically, the copper closing off the channels 4 of the substrate approximately simultaneously. In this way, a blind hole 4a is in each case produced from the channels 4. During this process, the copper wets the surface of the ceramic 2 in such a way that it covers both the first main surface 6 and the surfaces in the entry region of the channels 4.

FIG. 1c shows a further method step, in which the ceramic 2 is rotated and liquid electrically conductive second material 12 is filled into the openings of the channels 4 that are situated on the second main surface 8. In this example, the liquid material is a molten hard solder, e.g. AgCu28, which is poured into the channel openings at a temperature of approximately 800° C. Since the main surface 8 of the ceramic 2 that is not coated with adhesion agent repels the liquid AgCu28, said surface is not wetted. This means that no solid AgCu28 layer can form on the second main surface 8 during the cooling of the AgCu28 material. The ceramic 2 is thereby protected from damage that might be caused by a hot cooling-down metal layer bearing on the second main surface 8. Moreover, since AgCu28 bonds well with the copper 10 on the bottom of the blind holes 4a during cooling, the two materials form electrically conductive feedthroughs 3 from the first main surface 6 to the second main surface 8.

In the present exemplary embodiment, the various feedthroughs 3 are electrically conductively connected to one another via the galvanically applied copper layer 10 on the first main surface 6. If this is not desired, then the feedthroughs 3 can be electrically insulated from one another by grinding away the copper layer 10 down to the second main surface 8.

The embodiment described above is a specific example of a plurality of possible variations for producing feedthroughs. By way of example, substrate 2 may be made of a different material from ceramic. The material may be electrically conductive or non-conductive. As already mentioned, it may be e.g. a glass, e.g. microchannel glass (from Schott), plastic material, a glass-fiber- or carbon-reinforced laminate or a semiconductor substrate. When choosing the electrically conductive second material, care must be taken at any rate to ensure that its melting point is below the melting point of the substrate material, in order that the substrate 2 is not destroyed during the filling process.

The electrically conductive first material 10 for closing off the channels 4 may also vary depending on the material of the substrate, type of filling material used and depending on the application. By way of example, the electrically conductive first material 10 may be any metal or any metal alloy as long as it can be deposited or grown for closing off the channels 4 on one of the main surfaces of the substrate 2 and as long as it has a higher melting point than the electrically conductive second material 12 to be filled in liquid fashion later. The electrically conductive second material 12, that is to say the filling material, may correspondingly also be selected depending on the type of substrate and the closure material chosen, the second material may likewise being a metal or a metal alloy.

It should furthermore be stated that it is not essential to the invention whether or not the surface of the substrate 2 is repellent with respect to the electrically conductive second material 12. If the substrate surface is not repellent, that is to say that the substrate surface is largely wetted by the electrically conductive second material 12, then although the electrically conductive second material 12 would adhere to the second surface 8, it could be removed by subsequently being ground away on the second surface 8, so that the feedthroughs 3 could be insulated from one another again.

FIGS. 2a-2g schematically show a further exemplary embodiment for producing a substrate with feedthroughs. In this case, the substrate 2 is a monocrystalline silicon wafer having a diameter of e.g. 8 inches and a thickness of 400 micrometers, which is later singulated to form individual substrate chips. The substrate chips are intended to serve as chip carriers of integrated circuits in this example.

Figure 2A:
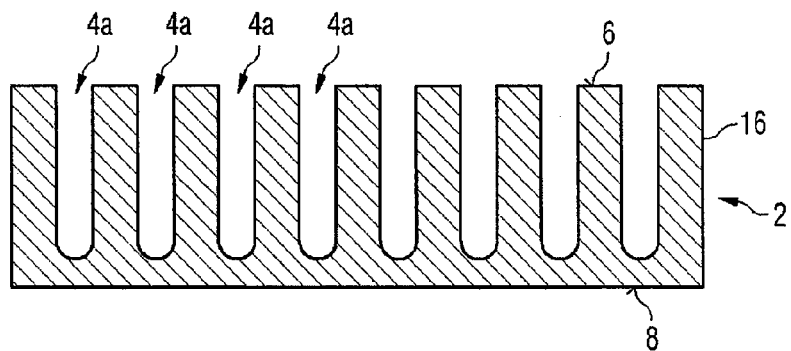
FIGS. 2a, 2b, 2c, 2d, 2e, 2f, and 2g show a further method for producing a plurality of feedthroughs through a substrate, a first insulation layer being applied to the surface of the substrate prior to the filling of the closed-off channels.
Figure 2B:
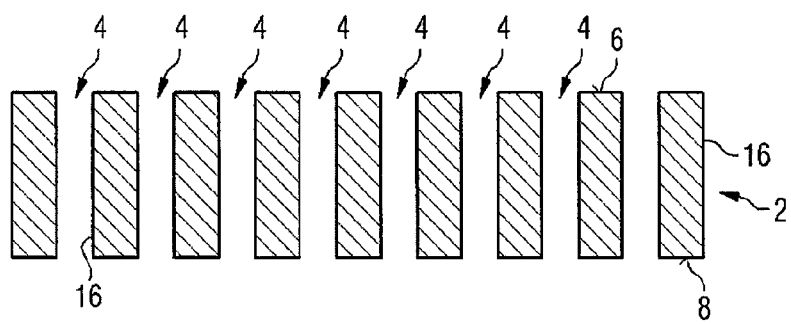

FIGS. 2a and 2b show a method for producing a substrate 2 having a multiplicity of channels 4. In this present case, firstly blind holes 4a having the same depth, e.g. 300 micrometers, and the same diameter, e.g. 8 micrometers, are produced at the first main surface 6 of the silicon wafer 2 by means of an electrochemical method (FIG. 2a). Afterwards, a layer thickness of somewhat more than 100 micrometers is removed at the second main surface 8 by means of chemical mechanical polishing (CMP step), so that the bottom of the blind holes is reached and the latter are opened from below. In this way, the blind holes 4a each having only one opening have become channels 4 each having two openings. The aspect ratio has the magnitude of approximately 35 in this example.

The electrochemical etching of blind holes ("pores") in silicon substrates is described e.g. in the patent specification EP 0296 348 A1 or in V. Lehmann, J. Electrochem. Soc. 140, 1993, page 2836 et seq. (both documents are to be understood in their entirety as part of this application). During the electrochemical etching, the first main surface 6 of the silicon substrate 2 that is to be etched is covered with a suitable electrolyte (e.g. HF acid having a concentration of e.g. 5%) and a voltage is subsequently applied between the second main surface 8 and the electrolyte. If the silicon substrate is n-doped, then the second main surface 8 may additionally be illuminated with a light source in order to initiate electron-hole pair formation on the second main surface. In this way, a current flow is generated between the second main surface 8 of the silicon wafer and the electrolyte, by means of which blind holes ("pores") are etched at selective locations of the first main surface 6. It should be mentioned here that the above-mentioned concentration of the HF acid may also deviate from 5% and lie within the range of between 1% and 20%, depending on the doping of the silicon substrate and pore form.

The positions on the first main surface 6 at which the current etches the blind holes may be predetermined by preceding selective incipient etches. The positions of the selective incipient etches may be determined e.g. by means of a photolithographically produced mask at which the incipient etches are performed. At the same time, the doping intensity determines the minimum distance between adjacent pores on the main surface. If, by way of example, a pore distance of at most 30 micrometers is desired on an n-doped silicon substrate, then the n-doped silicon substrate is doped in such a way that it has a resistivity of approximately 1000 ohm-cm. This corresponds to an n-type doping of approximately $4 \times 10^{12}$ cm$^{-3}$.

The length of the electrochemically etched blind holes is essentially given by the length of the etching time and may be between 25 micrometers and 2000 micrometers if the silicon wafer is sufficiently thick. The diameter of the blind holes may be set by the doping of the silicon and the current density and may lie within the range of 2 to 150 micrometers and here is approximately 8 micrometers. In the present case, the silicon wafer is n-doped material, approximately 1000 ohm-cm having been chosen for the resistivity of the silicon wafer.

As an alternative, the continuous channels 4 can also be produced by other etching methods known in micromechanics, such as reactive ion etching (RIE), laser drilling, sand-blasting or ultrasonic drilling. The channels thus produced extend through the substrate material and may have a depth within the range of 25 to 2000 μm, or between 100 and 250

µm. The diameter of the channels lies within the range of 2 to 150 µm, or between 10 and 30 µm.

As an alternative, fully or partially oxidized macroporous silicon or microchannel glass may also be used as starting material for a substrate.

Figure 2C:
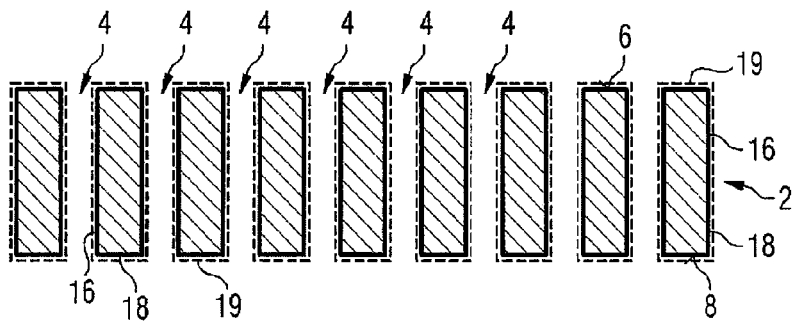

FIG. 2c shows a further method step, in which a thermally produced silicon dioxide (first insulation layer 18) is produced on the surface 16 of the silicon substrate, that is to say both on the two main surfaces 6, 8 and in the channels 4. The thermally produced first insulation layer 18 is illustrated by the boldfaced line of the surface 16 of the substrate 2 in FIG. 2c. By means of the first insulation layer 18, the silicon wafer 2 is insulated from the electrically conductive second material 12 that is to be introduced into the channels 4 later.

Optionally, a barrier layer (intermediate layer 19) may be applied to the first insulation layer 18, said barrier layer preventing the electrically conductive second material 12 that is to be applied later from diffusing into the semiconductor substrate 12. The barrier layer 19 may be e.g. TiN or TaN applied to the channel surface by vapor deposition or a CVD process. The layer thickness of the barrier layer is e.g. 100 nm. The barrier layer 19 is shown by way of example only in FIG. 2c and, since it is optional, is no longer indicated in the subsequent figures.

Other methods and insulation materials may also be used for the production of the first insulation layer 18; by way of example, the first insulation layer may be TEOS (tetraethyl orthosilicate) produced by means of a chemical vapor deposition (CVD) method, sputtered $SiO_2$ or silicon nitride produced from silane (SiH4) and ammonia (NH3). The first insulation layer 18 may also be a combination of different insulation layers, e.g. an ONO layer, which is a combination of the oxide-nitride-oxide layers mentioned above. The thickness of the insulation layer 18 lies within the range of 5 to 1000 nm, or between 100 and 200 nm, depending on the application. In this case, the insulation layer 18 covers all the surfaces 16 of the substrate, the first main surface 6 (front side), the second main surface 8 (rear side) and also the channel walls of the channels 4.

It shall be noted that the first insulation layer 18 is produced in the channels 4 and on the main surfaces 6, 8 simultaneously and by the same methods. This is an economical method procedure for electrically insulating the substrate 2 both in the channels 4 and at the main surfaces 6, 8 from the conductive layers that are to be applied later. The first insulation layer 18 may be applied in such a way that the layer thickness of the first insulation layer (18) in the channels 4 deviates from the layer thickness on the first or main surface 6, 8 by less than 50% or by less than 20%.

Figure 2D:
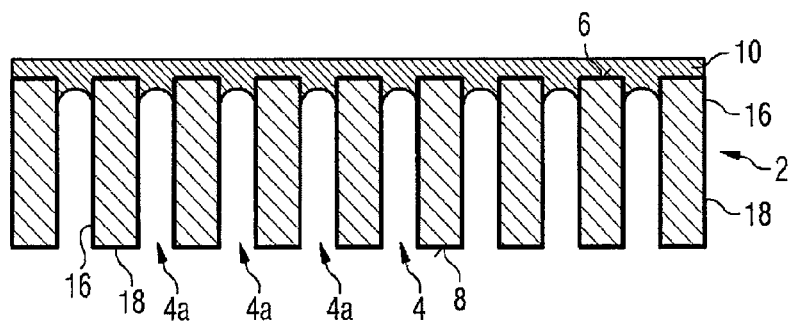

FIG. 2d shows a further method step, in which, after the production of the first insulation layer 18 and after application of an adhesion layer (not shown in FIG. 2d), e.g. made of Ti, TaN, to the first main surface 6, the first main surface 6 of the substrate is coated with a continuous metal layer made of a first material 10. This may be effected by electrochemical deposition (e.g. copper, Sn, Al, etc.), a CVD process step (e.g. tungsten) or by sputtering (e.g.: Al, AlSiCu, Ti, TiN, etc.). In this step, the open channels 4 are closed off again by the electrically conductive first material 10, so that blind holes 4a are once again formed from the channels 4.

Figure 2E:
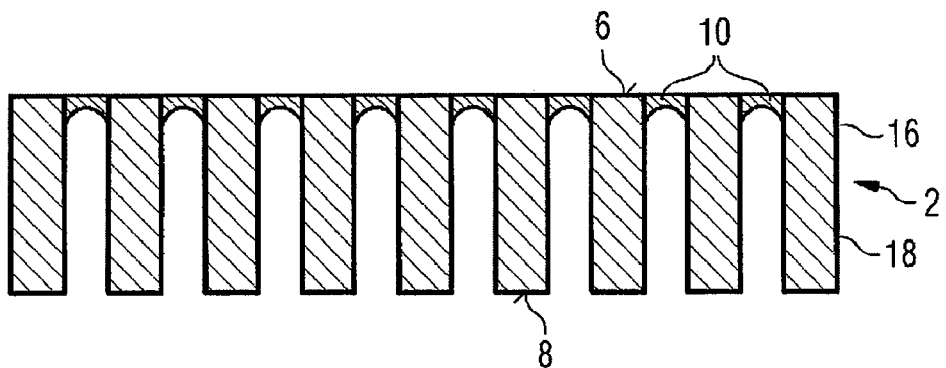

FIG. 2e shows the silicon wafer 2 after the deposited metal layer 10 has been removed by chemical mechanical polishing (CMP) to an extent such that only that part of the metal layer which projects into the depth of the blind holes has remained and closes off the through holes in pluglike fashion. In principle, all metals which can be removed in a CMP process (e.g.: Cu, W, Al, etc.) are suitable for the closure of the channels. It shall be noted that the plugs 10 formed by the partial removal of the metal layer 10 are no longer electrically conductively connected to one another.

Figure 2F:
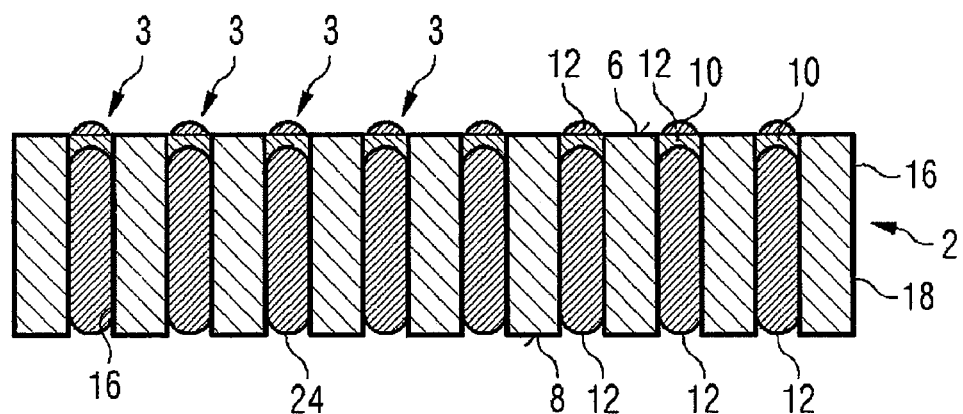

FIG. 2f shows the silicon wafer 2 after the blind holes 4a have been filled with a liquid electrically conductive second material 12, in this case the melt of an AgCu28 alloy, under relative reduced pressure in the blind holes. The filling of blind holes at relative reduced pressure is also described in V. Lehmann, "Sensors and Actuators" A95, 2002, page 202 et seq., the content of which is hereby intended to included as part of the present application. For the purpose of filling the blind holes 4a, the substrate 2 is firstly introduced into a gastight process chamber containing the melt of the second material 12 that is to be introduced into the blind holes 4a. The chamber is subsequently evacuated. At this point in time, the substrate 2 is situated above the surface of the melt 12, which is at a temperature of approximately 800° C. After a desired reduced pressure of 0.001 to 100 mbar, or less than 1 mbar, has been attained in the process chamber, the substrate 2 is dipped into the melt 12. Excess pressure is subsequently applied to the process chamber. The excess pressure is accordingly intended to lie within the range of 1 to 20 bar, or within the range of 5 to 10 bar. In this case, the minimum excess pressure depends on the process temperature, the surface tension of the metal used or the alloy 12 used, and the diameter of the blind holes. By virtue of the excess pressure now prevailing in the process chamber and the reduced pressure also produced prior to dipping in the blind holes, a relative reduced pressure prevails in the blind holes which forces the liquid AgCu28 into the blind holes 4a even though the surface tension of the liquid AgCu28 is high (approximately 1 $J/m^2$) and the capillary forces in the blind holes 4a are low on account of the repellent first insulation layer 18. As a result, it is possible to introduce liquid AgCu28 or other liquid metals even into very narrow blind holes without a wetting adhesion layer having to be applied to the walls of the channels 4. As a result, the introduced second material 12, in the present case AgCu28, in the blind holes 4a directly adjoins the first insulation layer 18. In particular, no adhesion layer made e.g. of Ti, TaN need be in the channels 4 between the first insulation layer 18 and the solidified second material 12, which considerably facilitates the production of feedthroughs 3.

After dipping and introduction of the liquid AgCu28 into the blind holes 4a, the silicon wafer 2 is drawn out of the melt 12 at excess pressure, so that the liquid AgCu28 in the blind holes can cool. Only after solidification is the pressure reduced to normal pressure.

The structure shown in FIG. 2f is obtained after the withdrawal of the silicon wafer 2 from the melt. The blind holes 4a have been completely filled with the solidified AgCu28 alloy up to the metal plug 10. The solidified AgCu28 alloy forms a pillar-type structure adapted to the channel form and having a cross-sectional area which occupies at least 50%, but generally more than 95%, of the channel cross-sectional area. The wettability of the surface of the metal plugs 10 with the liquid AgCu28 12 ensures that the metal filling 12 combines with the metal plug and forms a continuous feedthrough 3 through the entire silicon wafer.

In contrast to the good wettability of the plugs 10 by the electrically conductive second material 12, in this case AgCu28, no AgCu28 remains on the surface 16 of the first insulating layer 18 on account of the poor wettability thereof by the liquid AgCu28. Therefore, it is also no longer necessary to pattern the electrically conductive second material 12 in order to remove the latter from the two main surfaces 6, 8 of the silicon wafer 2. This ensures that the feedthroughs 3 are electrically insulated from one another without further patterning steps. At the same time, the poor wetting prevents the formation of residues of the AgCu28 on the main surfaces 8, 9, which might damage the silicon substrate 2 during cooling on account of the different coefficients of thermal expansion.

Figure 2G:
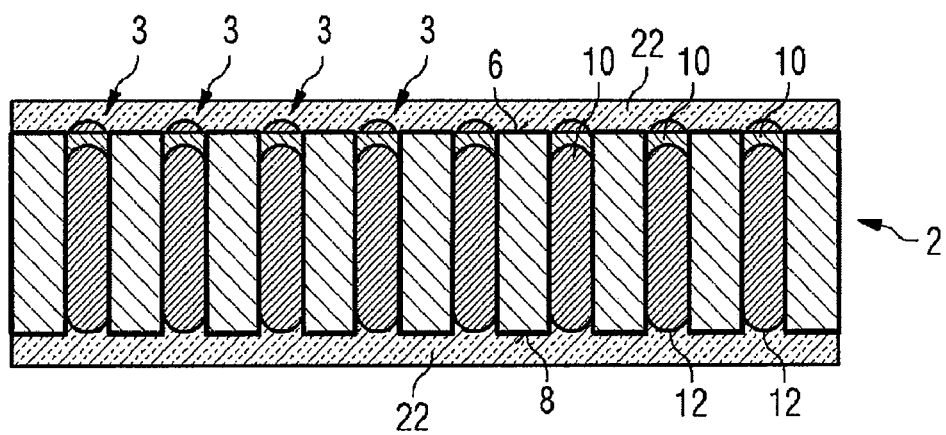

FIG. 2g shows the silicon wafer 2 after a second insulation layer 22, e.g. an oxide layer, has been deposited on both sides. Interconnects and electrical circuits comprising passive and active components can be constructed on said layer 22. The realization of the rewirings, resistances, inductances and capacitances on the structure is of particular interest. Capacitances can be realized particularly advantageously in the form of trench capacitances in which the feedthroughs 3 in each case constitute a first electrode, the first insulation layers 18 of the blind hole walls in each case constitute a dielectric, and the silicon substrate 2 constitutes a common second electrode of the capacitances. For this purpose, the silicon substrate 2 merely has to be contact-connected at a suitable location in order to define its potential.

This yields a substrate 2 having a high thermal conductivity and having feedthroughs 3 which connect the first surface 6 to the second surface 8 in a manner that exhibits good electrical conductivity, it being possible for each feedthrough 3 to be electrically insulated both from any further feedthroughs 3 and from the substrate 2.

It should be pointed out that in FIGS. 2f and 2g, the electrically conductive second material 12 in the channels 4 in each case has a convex surface curvature 24 on the opposite side to the blind holes 4a. Said curvature is the consequence of the low wettability of the substrate surface 16, in this case an oxide and/or nitride layer, by the electrically conductive second material 12, in this case the AgCu28. The low wettability may entail advantages to the effect that (a) the channels 4 can be filled completely and without formation of bubbles even in the case of a high aspect ratio, e.g. more than 10 or 100; (b) the substrate surface 16 even in the channels is not attacked either chemically or mechanically by the electrically conductive second material; (c) the hot electrically conductive second material 12 does not deposit on the two main surfaces 6, 8 of the substrate 2 and thus damage the substrate; and (d) patterning of the electrically conductive second material 12 is effected independently on the two main surfaces 6, 8 and further patterning measures are thus obviated.

Figure 3A:
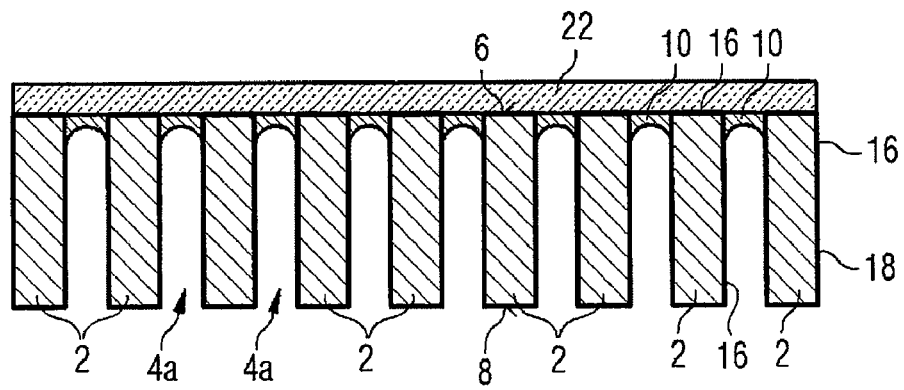
FIGS. 3a, 3b and 3c show a further method for producing a plurality of feedthroughs through a substrate, the second insulation layer being applied on the first main surface prior to filling with the first material.
Figure 3B:
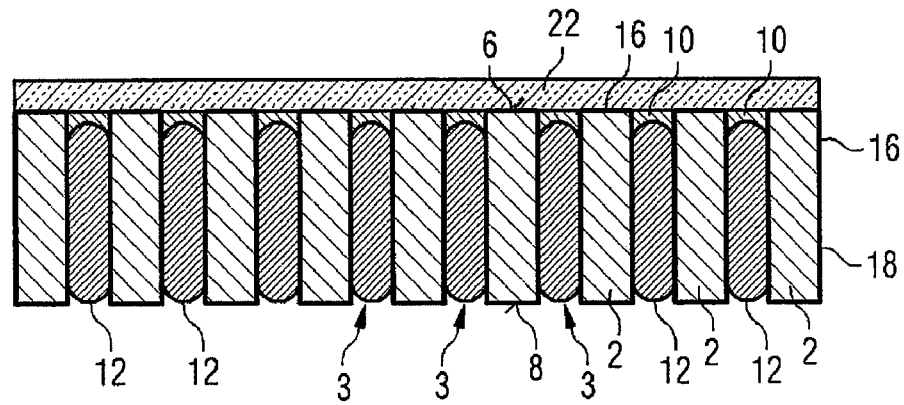
Figure 3C:
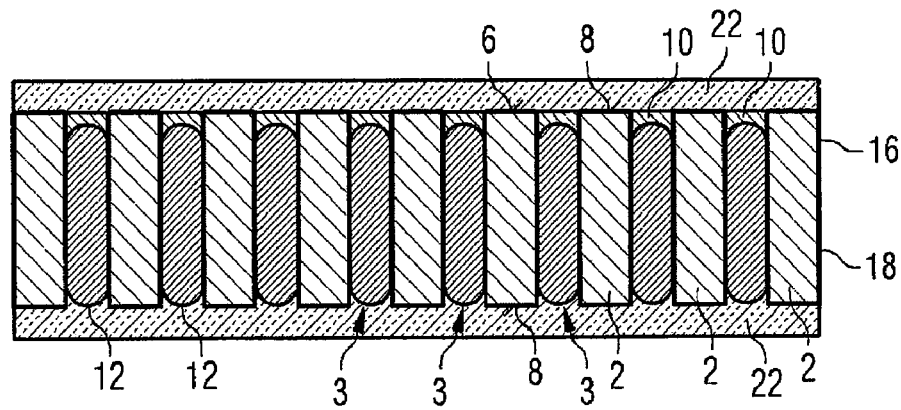

FIGS. 3a-3c schematically show a further embodiment for the production of a substrate 2 with feedthroughs 3, which is similar in various regards to that of FIGS. 2a-2g. Once again the substrate is a silicon wafer 2 and the substrate surface 16 is a layer made of SiO₂ and/or Si₃N₄. However, in the present embodiment, the second insulation layer 22 is applied on the first main surface 6 prior to the filling of the blind holes 4a and the second insulation layer 22 is applied on the second main surface 8 after the filling of the blind holes 4a. The closing off of the channels 4 with the first material 10 (e.g. copper) and also the filling of the closed-off channels (blind holes 4a) with the electrically conductive second material 12 (e.g. AgCu28) are effected in the same ways as described in FIGS. 2a-2g. It shall be noted that it is particularly favorable with regard to the method procedure if the second insulation layer 22 is a photoresist.

Figure 4A:
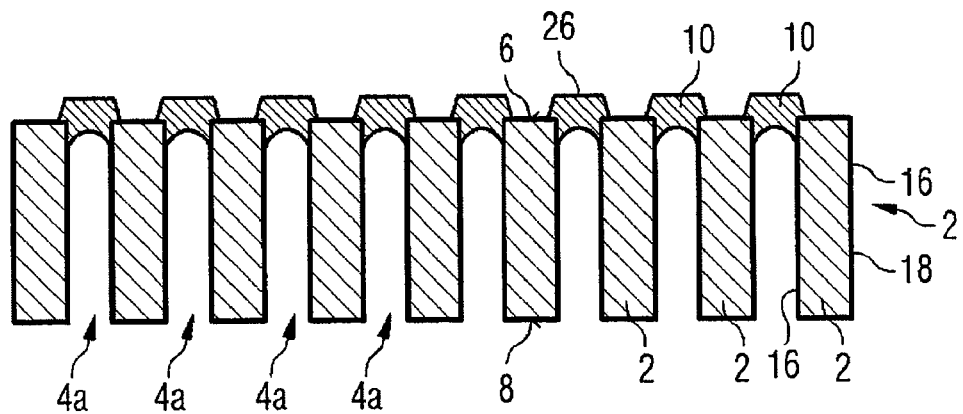
FIGS. 4a, 4b and 4c show a further method for producing a plurality of feedthroughs through a substrate, the electrically conductive first layer being patterned by means of a mask.
Figure 4B:
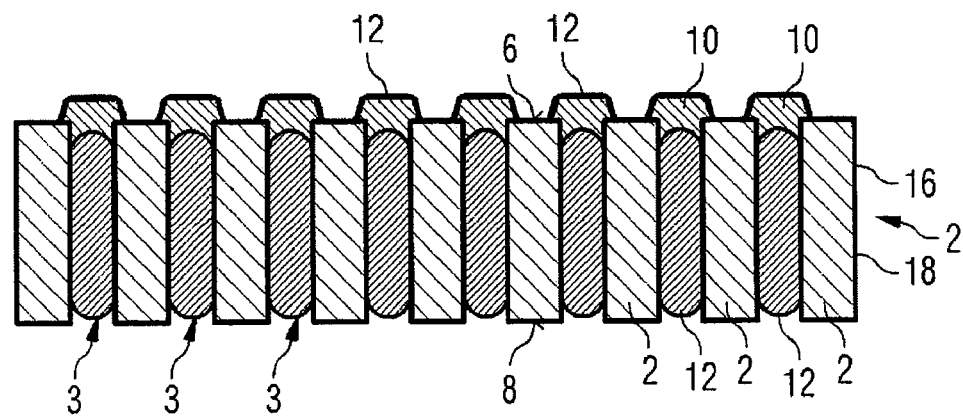
Figure 4C:
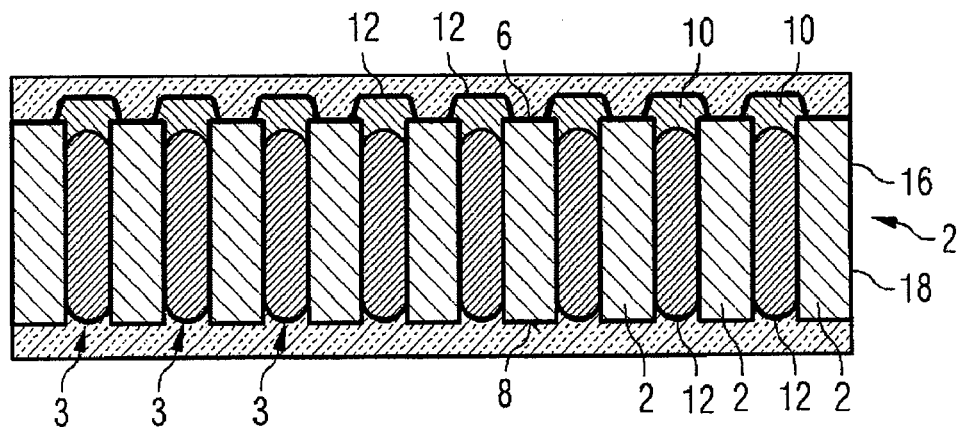

FIGS. 4a-4c show a further embodiment for the production of a substrate 2 with feedthroughs 3, which is similar in various regards to that of FIGS. 2a-2g. Once again the substrate is a silicon wafer 2 and the substrate surface 16 is a layer made of SiO₂ and/or Si₃N₄. However, as shown in FIG. 4a, the layer made of the first material 10 is patterned on the first main surface 6 not by means of a CMP step but rather by means of an etch selectively with respect to a photolithographically produced mask (not shown). This method has the advantage that the CMP method is not required for production. Furthermore, the projecting structure elements 26 of the patterned first material 10 can be used as connecting elements (e.g. as solder bumps) for external contact-connection.

The filling of the closed-off channels (blind holes 4a) with the electrically conductive second material 12 (e.g. AgCu28) (see FIG. 4b) and also the optional application of the second insulation layer 22 on the first main surface 6 and the second main surface 8 (see FIG. 4c) are effected in the same ways as described in FIGS. 2f-2g. It shall be noted that on account of the omitted CMP step, the electrically conductive second material 12, on account of its good wetting with regard to the electrically conductive first material 10, after filling by means of a bath in the melt, remains on the projecting structure elements 26 and forms a ball-type structure there.

Figure 5A:
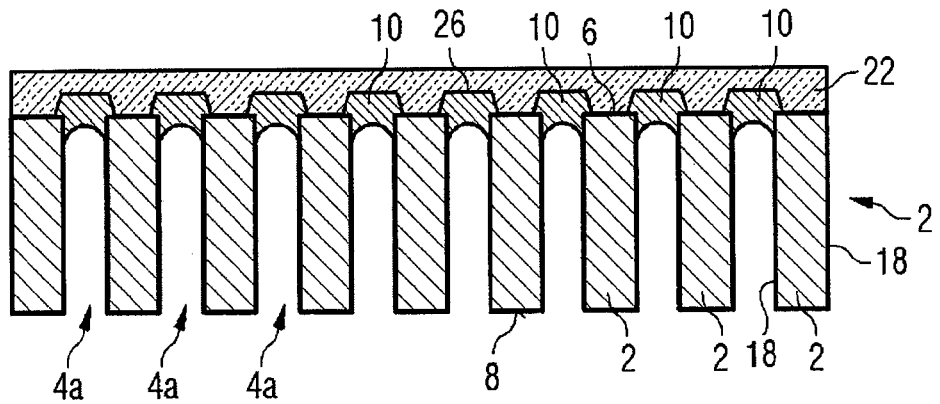
FIGS. 5a, 5b and 5c show a further method for producing a plurality of feedthroughs through a substrate, the electrically conductive first layer, prior to the filling of the closed-off channels, being patterned by means of a mask and covered with an insulating layer.
Figure 5B:
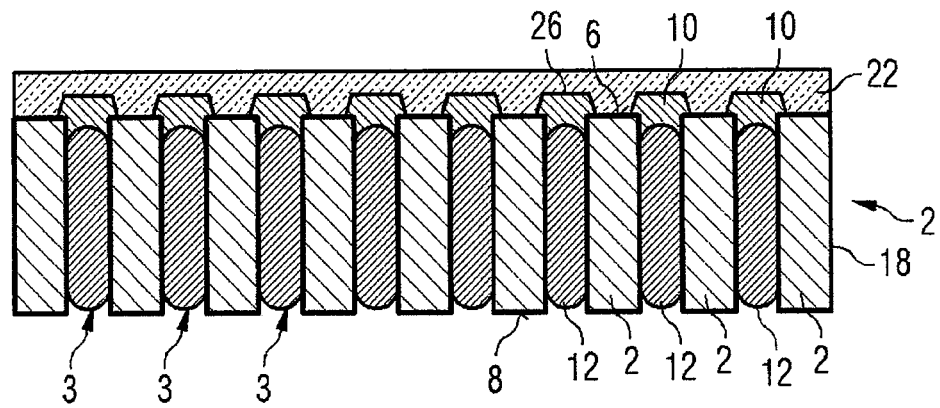
Figure 5C:
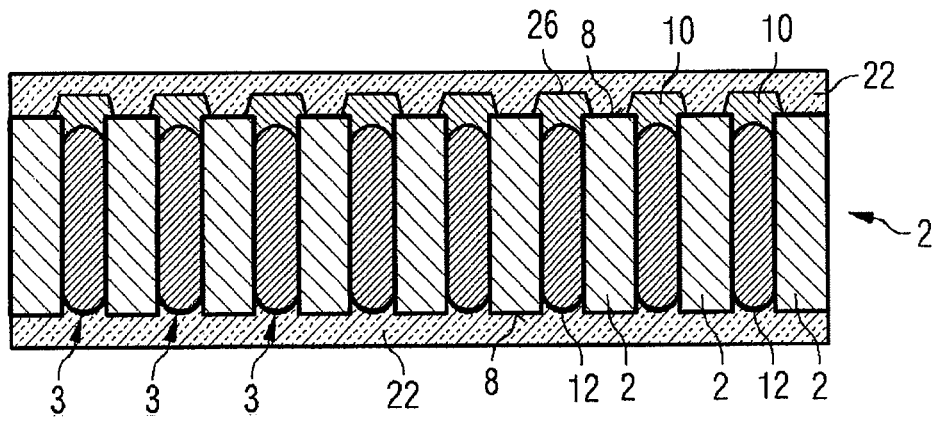

FIGS. 5a-5c schematically show a further embodiment for the production of a substrate 2 with feedthroughs 3, which is similar in various regards to that of FIGS. 3a-3c. Once again the substrate is a silicon wafer 2 and the substrate surface 16 is a layer made of SiO₂ and/or Si₃N₄. Once again, in the present embodiment, the second insulation layer 22 is applied on the first main surface 6 prior to the filling of the blind holes 4a and the second insulation layer 22 is applied on the second main surface 8 after the filling of the blind holes 4a. However, as already shown in FIG. 4a, the layer made of the first material 10 is patterned on the first main surface 6 not by means of a CMP step but rather by means of an etch selectively with respect to a photolithographically produced mask (not shown). The closing off of the channels 4 with the first material 10 (e.g. copper) and also the filling of the closed-off channels (blind holes 4a) with the electrically conductive second material 12 (e.g. AgCu28) are effected in the same ways as described in FIGS. 2a-2g. It shall be noted that, in contrast to FIG. 4c, the projecting structure elements 26 in FIGS. 5a-5c are not covered with the electrically conductive second material 12, since the electrically conductive first material 10 on the first main surface 6 had been covered with the second insulation layer 22 prior to filling.

FIGS. 6a-6f show a further exemplary embodiment, which is in various regards like that of FIGS. 2a-2g. However, in contrast to FIGS. 2a-2g, the first material 10 in FIGS. 6a-6g is not electrically conductive.

Figure 6A:
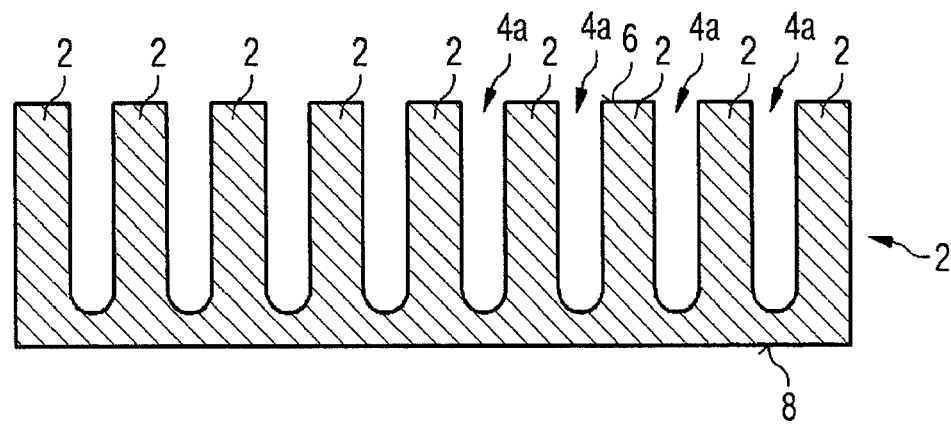
FIGS. 6a, 6b, 6c, 6d, 6e and 6f show a further method for producing a plurality of feedthroughs through a substrate, the channels being closed off with a carrier wafer coated with an organic material.
Figure 6B:
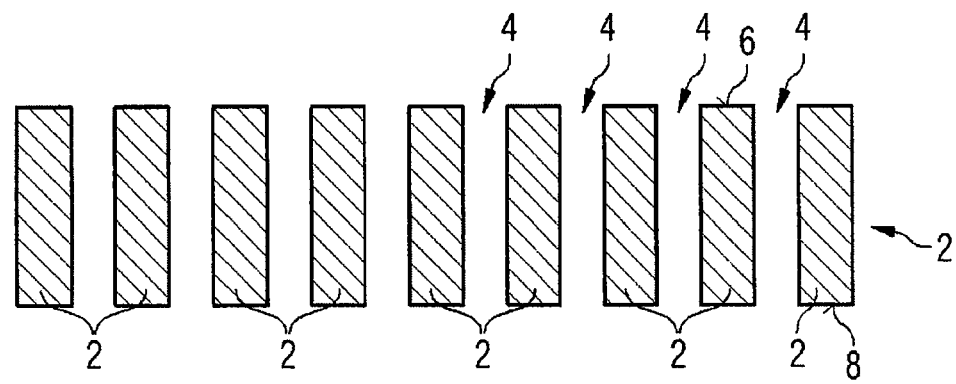

The production of the channels 4 in a silicon wafer 2 is shown in FIGS. 6a-6b, as in FIGS. 2a-2b. This is effected as shown in FIG. 2a, for example, by means of the electrochemical etching of silicon in an HF acid on the first main surface 6, possibly with rear-side illumination with a light source, until blind holes 4a ("pores") having a desired depth from the first main surface 6 in the direction of the second main surface 8 have been produced. The silicon wafer 2 may be lightly n- or p-doped (~1000 ohm-cm) silicon. Afterwards, on the second main surface, by means of Si grinding, CMP (chemical mechanical polishing), plasma etching or wet-chemical etching, the silicon is removed on the second main surface 8 until the bottom of the pores 4a is reached and the pores 4a have been opened (FIG. 2b).

As an alternative, the continuous channels 4 can also be produced by other etching methods known in micromechanics, such as reactive ion etching (RIE), laser drilling, sandblasting or ultrasonic drilling. The channels 4 produced extend through the substrate material 2 and may have a depth within the range of 25 to 2000 micrometers, or between 100 and 250 micrometers, depending on the thickness of the substrate. The diameter of the pores lies within the range of 2 to 150 micrometers, or between 10 and 30 micrometers. Instead of beginning with a silicon wafer, it is also possible to begin with a substrate as shown in FIG. 6b, where the substrate 2 may be fully or partially oxidized macroporous silicon (see e.g. WO 2003089925) or glass, e.g. microchannel glass.

Figure 6C:
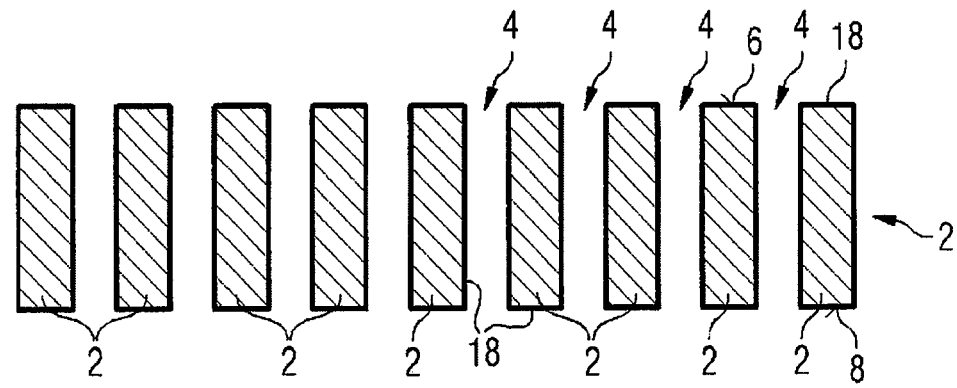

In FIG. 6c, as described in FIG. 2c, the surface 16 of the silicon wafer 2 is provided with a first insulation layer 18, in the present case with a thermally produced silicon dioxide. This is indicated in FIG. 6c by the bold faced lines which extend both along the first and second main surfaces 6, 8 and along the channel walls of the channels 4.

As already shown for the exemplary embodiments in FIGS. 2a-2g, other methods and insulation materials (or layer sequences thereof) may be used for the first insulation layer 18; by way of example, the first insulation layer 18 may be TEOS (tetraethyl orthosilicate) produced by means of a chemical vapor deposition method (CVD) or sputtered $SiO_2$ or silicon nitride produced from silane ($SiH_4$) and ammonia ($NH_3$). The thickness of the first insulation layer 18 lies within the range of 5 to 1000 nm, or between 100 and 200 nm. In this case, the first insulation layer 18 covers all the surfaces of the substrate 2, the first main surface 6 (front side), the second main surface (rear side) and also the inner walls of the channels 4.

Figure 6D:
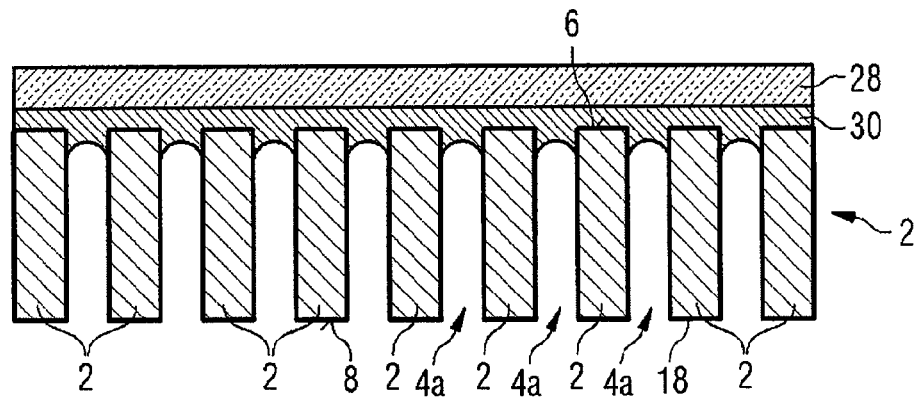

In FIG. 6d, the channels 4 are closed off, in a first embodiment, with a planar carrier wafer 28, to the surface of which an organic resist 30 has been applied. Said carrier 28 may itself be a silicon wafer which is placed onto the planar first main surface 6. The organic resist 30 serves (a) to produce a sealing adhesion between the substrate 2 and the carrier 28; and (b) to constitute a sacrificial layer that an easily be removed. The channels 4 are closed off by the carrier wafer 28 and the organic resist 30, so that they form blind holes 4a again.

Figure 6E:
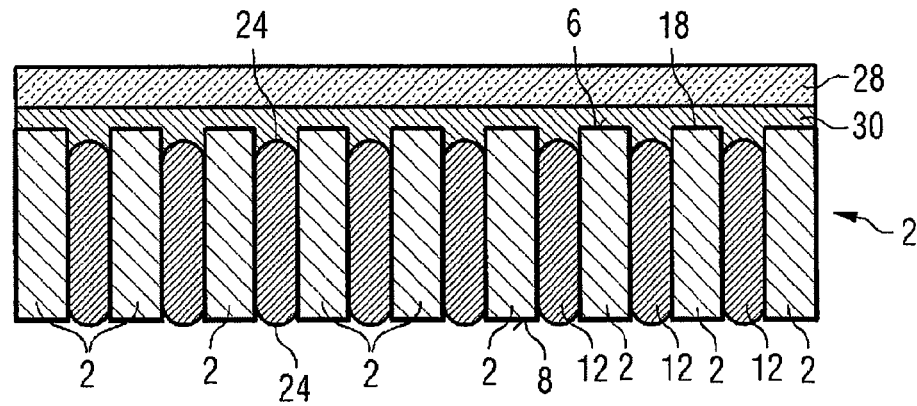

In FIG. 6e, as already described in FIG. 2f, the blind holes 4a have been filled with a liquid electrically conductive second material 12 in a melt at a relative reduced pressure prevailing in the blind holes 4a. In the case of the silicon substrate 2, the melt is a metal melt, such as at least one of copper, silver or a silver-based hard solder (e.g.: AgCu28 alloy). The first insulation layer 18 made of silicon dioxide and/or silicon nitride is not attacked by the liquid melt; the liquid metal does not wet $SiO_2$ and $Si_3N_4$. This is also apparent from the convex surface curvatures 24 of the electrically conductive second material 12.

Figure 6F:
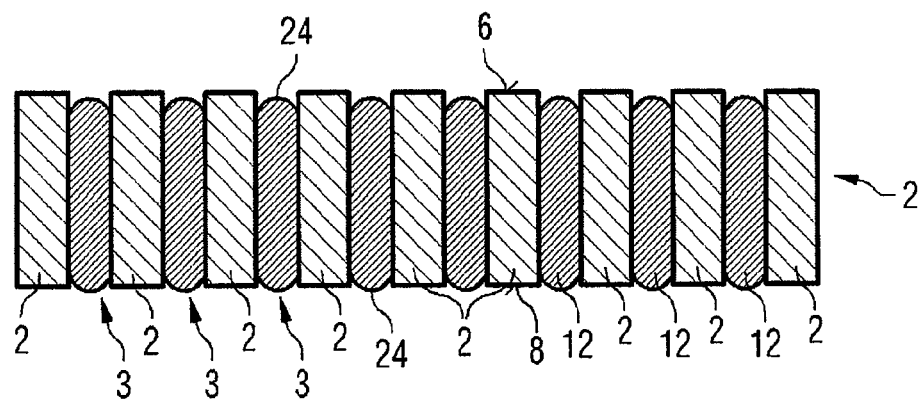

FIG. 6f shows the silicon wafer 2 after the carrier wafer 28 has been removed, e.g. by mechanical displacement, and the organic resist 30 has been burnt in an oxygen-rich atmosphere or in an $O_2$ plasma. What remains is the silicon wafer 2 having the feedthroughs 3 filled with electrically conductive second material 12 from the first main surface 6 to the second main surface 8.

Figure 7A:
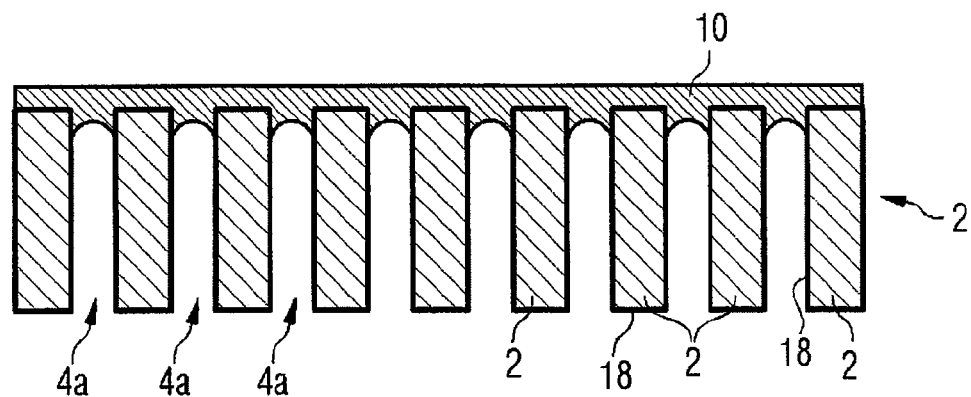
FIGS. 7a, 7b and 7c show a further method for producing a plurality of feedthroughs through a substrate, the channels being closed off with a plastic film or a carbon-containing material.
Figure 7B:
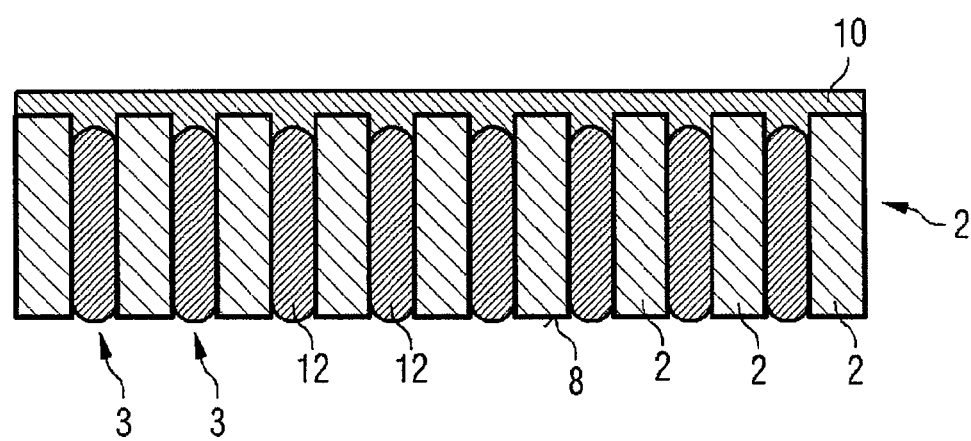
Figure 7C:
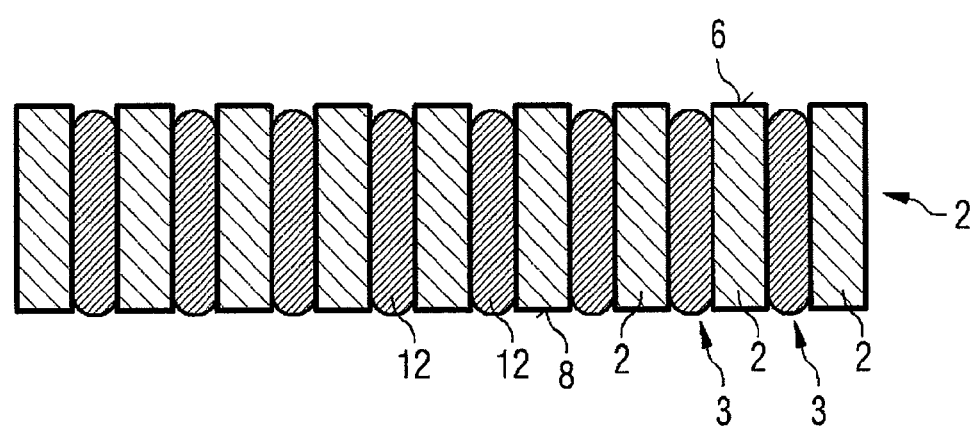

FIGS. 7a-7c show a further exemplary embodiment, in which the channels 4 of the silicon wafer 2 coated with an oxide or nitride layer 18 are closed off with a first material 10, which is a graphite layer (carbon film or diamond) or else a plastic film, instead of by a carrier wafer, so that the blind holes 4a are formed (FIG. 7a). The deposition of graphite or a carbon layer is typically effected by pyrolysis of methane, ethylene or acetylene in the presence of hydrogen (reducing environment) at temperatures of >700° C. and at <10 mbar. The continuous channels 4 of the silicon wafer 2 can be closed off as an alternative.

FIG. 7b shows the silicon wafer 2 after the blind holes 4a have been filled with an electrically conductive second material 12, e.g. AgCu28. The filling is effected in the same way as has been described for FIG. 2f or 6e. The graphite layer 10 is subsequently burnt at elevated temperature in the presence of oxygen. An $O_2$ plasma may be used for the removal (FIG. 7c).

Figure 8A:
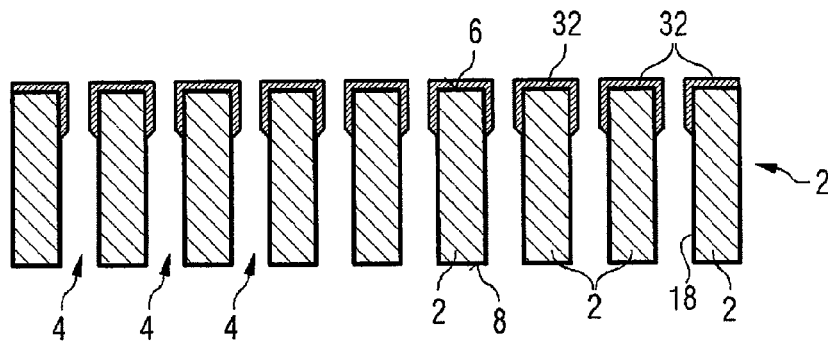
FIGS. 8a, 8b, 8c and 8d show a further method for producing a plurality of feedthroughs through a substrate, the channels being metallized before they are closed off.

FIGS. 8a-8d show a further exemplary embodiment, in which the channels 4 of the silicon wafer 2 coated with an oxide or nitride layer 18 are provided with a metal layer 32 at the first main surface 6 of the silicon wafer 2 (FIG. 8a). The metal layer 32 may be deposited for example by vapor deposition, sputtering or CVD processes (and variants thereof). By way of example, copper, aluminum, tungsten and platinum are appropriate here depending on the metal melt chosen.

Figure 8B:
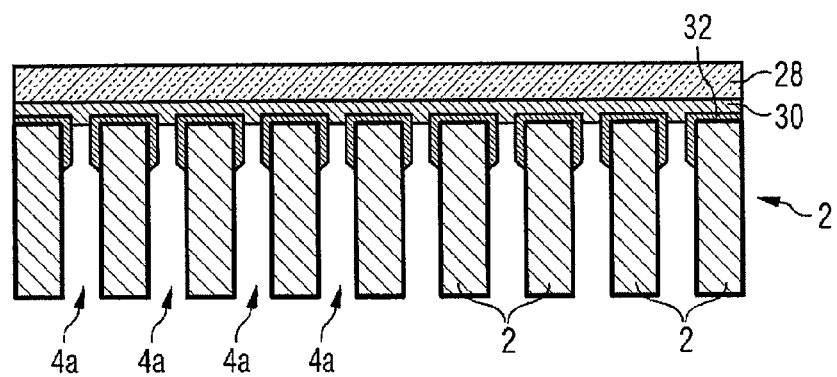
Figure 8C:
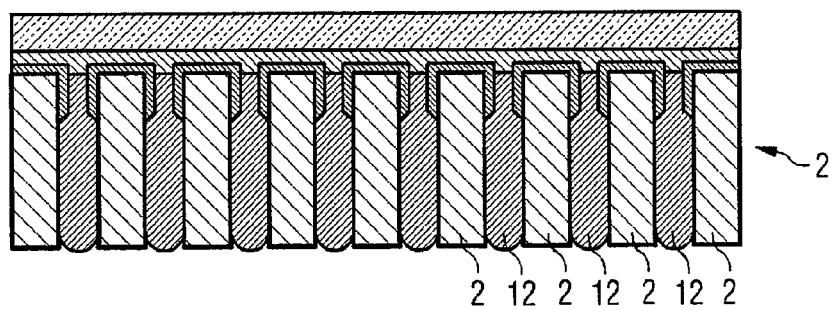
Figure 8D:
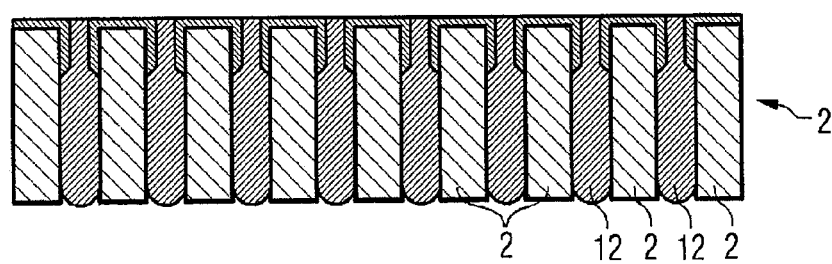

FIG. 8b shows the substrate 2 after the channels 4, as already described in FIG. 6d, have been closed off with a carrier wafer 28 provided with an organic resist 30, so that the blind holes 4a are formed. When the channels 4 are filled with the metal melt 12, the metallized regions 32 of the blind holes 4a are wetted or incipiently alloyed with the melt 12 (FIG. 8c). This ensures a defined rising height of the metal melt 12. The process is shown by way of example in the variant with the carrier wafer 28 in FIGS. 8a-8d. A different first material 10, for example a graphite layer, could likewise be used, however, for closing off the channels.

Figure 9:
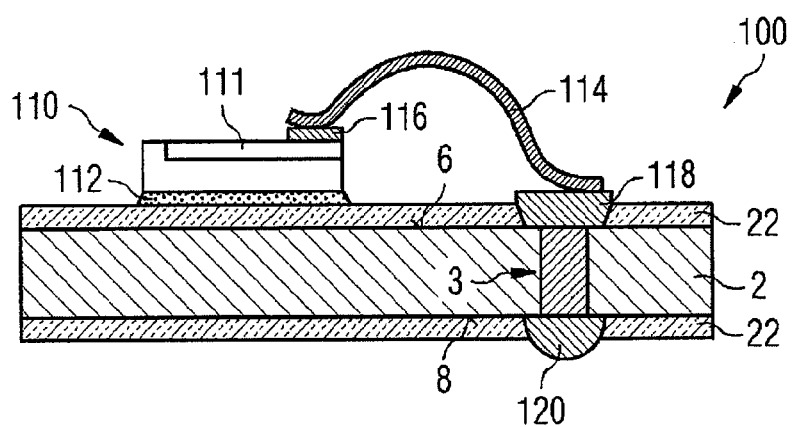
FIG. 9 shows a semiconductor module having a substrate and an integrated component, the integrated circuit of the component being connected to the substrate by means of a bonding wire.

FIG. 9 schematically shows a semiconductor module 100 having a substrate 2 having a feedthrough 3 from the first main surface 6 to the second main surface 8. The feedthrough 3 has been produced by one of the methods described above, for example as described in FIGS. 2a-2g. In this case, the substrate 2 is a semiconductor substrate, e.g. a silicon chip, the second insulation layers 22 applied to the first and second main surfaces 6, 8 of the substrate are an oxide (see FIG. 2g), and the filling of the feedthrough 3 is e.g. AgCu28 covered with copper on one side. The first insulation layer 18 is not shown in FIG. 9.

The rear side of an integrated semiconductor component 110 having an integrated circuit 111 on the front side is adhesively bonded onto the oxide layer 22 by means of an adhesive 112. The semiconductor component 110 is electrically connected to the substrate by means of a bonding wire 114 leading from a bonding contact location 116 of the semiconductor component 110 to a bonding contact location 118 of the substrate 2. In the present case, the bonding contact location 118 of the substrate is applied directly to the feedthrough 3 of the substrate. Through this the bonding wire is directly connected to an external contact 120, in the present case a solder ball 120.

The contact-connection of the bonding contact location 118 to the feedthrough 3 is effected in a manner that is well known to the person skilled in the art: firstly, the oxide layer 22 on the first main surface 6 has to be opened at the location of the feedthrough. This may be effected by means of an etch selectively with respect to a photolithographically produced mask (not shown). Afterwards, a metal layer, e.g. aluminum, is applied to the oxide layer 22 and patterned photolithographically in such a way that a layer element 118 that is large enough for a wire connection 118 remains.

The contact connection of the solder ball 120 is effected analogously in a manner known to the person skilled in the art: firstly, the oxide layer 22 on the second main surface 8 may be opened at the location of the feedthrough. This may be effected by means of an etch selectively with respect to a photolithographically produced mask (not shown). Afterwards, the second main surface 8 is brought into contact with a copper solder melt, so that the copper solder wets the surface of the feedthrough 3. A ball-type solder ball 120 remains after cooling.

Figure 10:
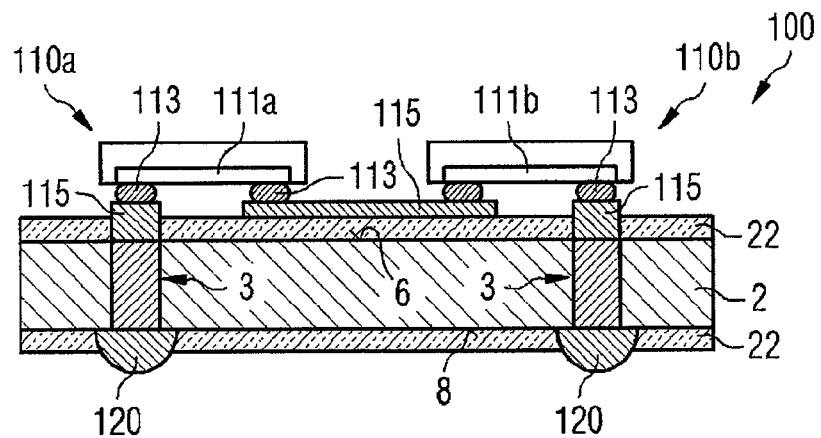
FIG. 10 shows a semiconductor module having a substrate and an integrated component, the integrated circuit of the component being connected to the substrate by means of solder balls.

FIG. 10 schematically shows a further semiconductor module 100 having a substrate 2 having two feedthroughs 3 from the first main surface 6 to the second main surface 8. The semiconductor module 100 is constructed like that of FIG. 9. However, in contrast to FIG. 9, the present semiconductor module 100 has two integrated components 110a, 110b which have been applied to the substrate 2 by their front sides, that is to say by the side having the integrated circuits 111a, 111b. In this case, the electrical connection to the substrate 2 is not effected by means of bonding wires, but rather by means of solder ball contacts 113 which connect the bonding contact locations 116 of the integrated components to interconnects 115 applied on the substrate 2. This bonding method is also known by the term "flip-chip bonding" and will not be explained any further here.

As can be gathered from FIG. 10, some interconnects 115 run directly over feedthroughs 3 and are electrically conductively connected to the latter. In this way, it is possible to lead bonding contact locations 116 of the integrated components via the feedthroughs 3 directly to one of the external contacts 120. This saves long interconnects and improves the signal transmission, particularly at high frequencies.

It can furthermore be gathered from FIG. 10 that some interconnects 115 run in such a way that they connect the bonding contact locations 116 of one integrated component 110a to those of the other integrated components 110b. In this way, different integrated circuits 111a, 111b can be connected to one another without requiring further external contacts 10. Integrated circuits can thus be packed even more densely.

It should be pointed out that the embodiments of FIG. 9 and FIG. 10 have silicon wafers or silicon chips as substrate 2. This has the advantage that the coefficient of thermal expansion (CTE) of the substrate 2 is the same as that of the integrated circuits, which are usually likewise produced on a silicon basis. This helps to reduce mechanical stresses between substrate 2 and integrated component 110. Furthermore, in comparison with e.g. a ceramic, silicon has a good thermal conductivity in order to effectively dissipate the heat generated by the integrated circuits. Furthermore, the etching of blind holes in an electrochemical manner can be carried out particularly effectively using silicon. Despite these advantages, the substrates 2 illustrated in FIG. 9 and FIG. 10 may also be ceramics, glass or other materials.

Figure 11:
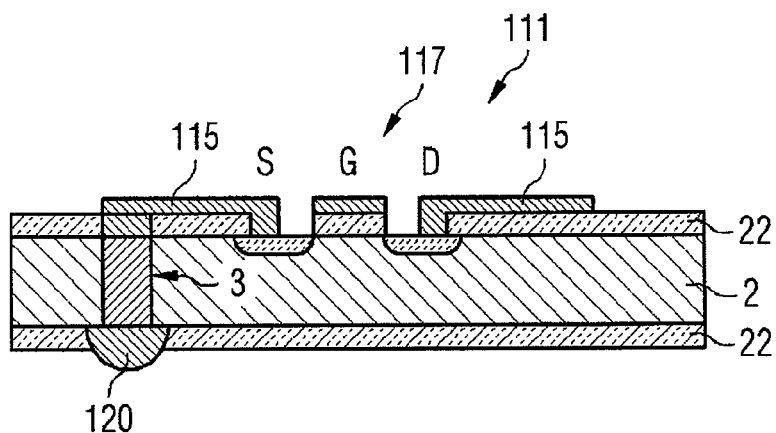
FIG. 11 shows a semiconductor module having a substrate and an integrated circuit, the integrated circuit being integrated into the substrate.

FIG. 11 schematically shows a further semiconductor module 100 having a substrate 2 having a feedthrough 3 from the first main surface 6 to the second main surface 8. The semiconductor module 100 is constructed like that from FIG. 9. However, in contrast to FIG. 9, the integrated circuit 111 is integrated into the substrate 2 itself. FIG. 11 shows a transistor 117, by way of example. Source S and drain D of the transistor 117 are produced by dopings of the monocrystalline silicon substrate 2, while the gate G is produced by thermal oxidation, which arose e.g. during the production of the second insulation layer. FIG. 11 furthermore shows interconnects 115 which connect the source S to the feedthrough 3 and/or respectively make contact with the gate G and the drain D. In this way, the feedthroughs 3 enable short connecting links of the active and passive components of the integrated circuits (resistors, transistors, diodes, coils, capacitors, etc.) to the external connections. This obviates long interconnections and hence the need for multiple interconnect planes.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A method for producing a substrate with at least one feedthrough, the method comprising:

providing a substrate having at least one channel from a first main surface of the substrate to a second main surface of the substrate;

forming a first insulation layer of tetraethyl orthosilicate to cover the first main surface and the second main surface of the substrate, and an inner surface of the at least one channel;

applying a barrier layer of at least one of TiN and TaN to the first inulation layer;

applying a metal layer to entirely cover only the first main surface of the substrate and partially cover only a portion of the inner surface of the at least one channel adjacent to the first main surface of the substrate;

closing off the at least one channel with an electrically conductive first material; and filling the closed-off at least one channel with an electrically conductive second material, wherein only a portion of the electrically conductive second material adjacent to the first main surface of the substrate is in direct contact with a vertical portion of the metal layer, and wherein only the first main surface of the substrate is entirely covered by a horizontal portion of the metal layer.

2. The method of claim 1 wherein the at least one channel is formed by an etch on the first main surface of the substrate.

3. The method of claim 1 wherein the at least one channel is formed by producing a blind hole on one of the main surfaces of the substrate and removing substrate material on the other main surface of the substrate.

4. The method of claim 1 and further comprising forming a first insulation layer on the substrate.

5. The method of claim 4 wherein the first insulation layer is an oxide and/or a nitride.

6. The method of claim 4 wherein the first insulation layer is at least one of a silicon oxide, a silicon nitride, and an organic dielectric.

7. The method of claim 1 wherein the electrically conductive first material is produced by an electrochemical deposition, by a chemical vapor deposition (CVD) process or by a sputtering process.

8. The method of claim 1 wherein the electrically conductive first material comprises at least one of copper, tungsten, aluminum, gold, AlSiCu, Ti, TiN, Zn, Sn, Pb, Ag, Cd, Ni, a hard solder and a soft solder.

9. The method of claim 1 wherein the electrically conductive first material is patterned and removed after the filling of the at least one channel, and wherein the electrically conductive first material comprises graphite.

10. The method of claim 1 wherein the electrically conductive second material is liquid in the process of filling the at least one channel and wherein the liquid electrically conductive second material is introduced into the at least one channel using reduced pressure in the at least one channel and/or excess pressure outside the at least one channel.

11. The method of claim 10 wherein the liquid electrically conductive second material selectively wets the electrically conductive first material with respect to the insulation layer.

12. The method of claim 1 wherein the electrically conductive second material comprises a metal having a melting point lower than the melting point of the electrically conductive first material.

13. The method of claim 1 and further comprising applying an integrated component to the substrate, wherein the integrated component has an integrated circuit and is applied to the substrate in such a way that the integrated circuit faces the substrate.

14. A method for producing a substrate with at least one feedthrough, the method comprising:
- providing a substrate having at least one channel from a first main surface of the substrate to a second main surface of the substrate;
- forming a first insulation layer of tetraethyl orthosilicate to cover the first main surface and the second main surface of the substrate, and an inner surface of the at least one channel;
- applying a barrier layer of at least one of TiN and TaN to the first inulation layer;
- applying a metal layer to entirely cover only the first main surface of the substrate and partially cover only a portion of the inner surface of the at least one channel adjacent to the first main surface of the substrate;
- closing off the at least one channel with an electrically conductive first material; and
- filling the closed-off at least one channel with a hard solder,
- wherein only a portion of the electrically conductive second material adjacent to the first main surface of the substrate is in direct contact with a vertical portion of the metal layer, and wherein only the first main surface of the substrate is entirely covered by a horizontal portion of the metal layer.

15. A method for producing a substrate with at least one feedthrough, the method comprising:
- providing a substrate having at least one channel from a first main surface of the substrate to a second main surface of the substrate;
- generating a first insulation layer of tetraethyl orthosilicate to cover the first main surface and the second main surface of the substrate, and an inner surface of the at least one channel;
- applying a barrier layer of at least one of TiN and TaN to the first inulation layer;
- applying a metal layer to entirely cover only the first main surface of the substrate and partially cover only a portion of the inner surface of the at least one channel adjacent to the first main surface of the substrate;
- closing off the at least one channel with a first material; and
- filling the closed-off at least one channel with an electrically conductive second material selectively to the first insulation layer,
- wherein only a portion of the electrically conductive second material adjacent to the first main surface of the substrate is in direct contact with a vertical portion of the metal layer, and wherein only the first main surface of the substrate is entirely covered by a horizontal portion of the metal layer.

16. The method of claim 14, wherein the at least one channel is formed by an etch on the first main surface of the substrate.

17. The method of claim 15, wherein the at least one channel is formed by an etch on the first main surface of the substrate.

* * * * *

UNITED STATES PATENT AND TRADEMARK OFFICE
CERTIFICATE OF CORRECTION

PATENT NO. : 8,263,491 B2  
APPLICATION NO. : 11/875711  
DATED : September 11, 2012  
INVENTOR(S) : Binder et al.

It is certified that error appears in the above-identified patent and that said Letters Patent is hereby corrected as shown below:

In the Claims

In column 18, line 9, in claim 1, delete "inulation" and insert --insulation--, therefor In column 19, line 11, in claim 14, delete "inulation" and insert --insulation--, therefor In column 20, line 6, in claim 15, delete "inulation" and insert --insulation--, therefor Signed and Sealed this
Twenty-second Day of September, 2015

Michelle K. Lee
*Director of the United States Patent and Trademark Office*